United States Patent [19]
Millar

[11] Patent Number: 6,087,868
[45] Date of Patent: Jul. 11, 2000

[54] DIGITAL DELAY LOCKED LOOP

[75] Inventor: Bruce Millar, Stittsville, Canada

[73] Assignee: Mosaid Technologies Incorporated, Kanata, Canada

[21] Appl. No.: 09/069,140

[22] Filed: Apr. 29, 1998

[30] Foreign Application Priority Data

Apr. 30, 1997 [CA] Canada ................................ 2204089

[51] Int. Cl.[7] .................................................. H03L 7/06
[52] U.S. Cl. .......................... 327/156; 327/158; 327/161; 327/270; 327/276
[58] Field of Search ................................ 327/156, 158, 327/159, 161, 162, 163, 263, 270, 276, 392, 393

[56] References Cited

U.S. PATENT DOCUMENTS

| | | | |
|---|---|---|---|
| 3,633,116 | 1/1972 | Richman | 37/94 |
| 4,789,996 | 12/1988 | Butcher | 327/158 |
| 5,087,829 | 2/1992 | Ishibashi et al. | 327/158 |
| 5,544,203 | 8/1996 | Casasanta et al. | 375/376 |
| 5,610,543 | 3/1997 | Chang et al. | 327/158 |
| 5,687,202 | 11/1997 | Eitrheim | 375/376 |
| 5,923,715 | 7/1999 | Ono | 375/376 |

Primary Examiner—Timothy P. Callahan
Assistant Examiner—An T. Luu
Attorney, Agent, or Firm—Pascal & Associates

[57] ABSTRACT

An improved edge-triggered fully digital delay locked loop (DLL), which maintains reliable synchronization from startup and in spite of system clock jitter is described. An internal clock signal is synchronized with a reference clock signal by propagating the reference clock signal through a variable digital delay path. A wide phase detection region surrounds a selected rising edge of the internal clock signal. The DLL loop is open as long as the internal clock signal and a target edge of the reference clock signal are not simultaneously within the phase detection region. To achieve a DLL locked condition, the variable delay is increased from a minimum setting until the edge of the phase detection region is shifted in time just past the target edge of the reference clock. Once the DLL loop has been closed, a clock jitter filter is enabled to reject reference clock jitter effects on the DLL locked condition. A digital phase detector controls the delay line propagation delay to establish synchronization between the internal clock and the reference clock. Unused delay elements within the variable delay path are deactivated to save power.

10 Claims, 6 Drawing Sheets

DIGITAL DELAY LOCKED LOOP

FIELD OF THE INVENTION

This invention relates to digital delay locked loops for use in high frequency clock synchronization applications.

BACKGROUND TO THE INVENTION

In synchronous dynamic random access memory (SDRAM) applications, as frequencies approach 200 MHz, the inherent analog delay between an external, system or reference clock and the time output data is valid, is becoming a crucial constraint. Such a delay of e.g. 4–10 ns is large enough to make a following clock cycle overlap the data, i.e. the delay becomes large enough for data not to be ready at the output during one cycle, and it essentially becomes "off-sync". This inherent internal delay must therefore be accelerated according to the necessary frequency but in a controlled fashion. The problem translates into a synchronization task between the internal clock, which controls the output path, and the correct edge of the external clock.

Analog delay locked loops have been employed in the past to perform the synchronization, which are comprised of a delay chain having the delay of its elements varied by analog bias voltages supplied by a phase detector. In digital systems such as memories, microprocessors and application specific integrated circuits, these types of delay locked loops introduce analog design complications in a mainly digital design, and therefore are avoided.

Digital delay locked loops use a digitally adjustable delay line. Digital information is used to either include or exclude a certain number of delay elements within a delay chain. Although digital delay locked loops have a much higher jitter than analog delay locked loops, their ease of implementation in a digital system makes them the preferred solution in most digital applications.

Previously, various digital delay locked loop techniques have been used to address clock synchronization problems, for example as described in U.S. Pat. No. 5,311,483 to Takasugi and U.S. Pat. No. 4,754,164 to Flora et al. Background information concerning digital delay lines is given in U.S. patent application Ser. No. 08/638,809 filed in the name of Maamoun Abouseido and assigned to Mosaid Technologies Incorporated.

U.S. Pat. No. 5,355,037 issued Oct. 11, 1994 to Andresen et al describes a digital delay locked loop, and a representation of key elements thereof is illustrated in FIG. 1. In the disclosed approach, a digital clock waveform is synchronized with a reference clock waveform by propagating the reference clock through a delay path having an adjustable propagation delay. The delay of the delay path is increased from a minimum setting until the edge of the delayed reference clock is eventually time-shifted just past the next corresponding edge of the reference clock. A digital phase detection circuit is employed to control the delay line propagation delay so that the delayed clock remains synchronized with reference clock.

FIG. 1, depicting a common implementation of the prior art, includes: a phase detector 1 comprised of a D-type flip-flop 25, cross-coupled NAND gates 19 and 21 which form an RS flip-flop, AND gates 23 and 28, and a fixed delay circuit 27; a digital delay line 2 which comprises a series of identical delay elements; a right/left shift register 4 having one stage per delay element; internal clock input and output buffers 10 and 12; and, optionally, as further discussed in an application note published by the assignee of U.S. Pat. No. 5,355,037, Texas Instruments, a reference delay circuit 7, and a shift clock generator 8 producing a shift clock signal CLKS with frequency of one half the reference clock frequency CLKR. In the simplest application of prior art, shown in FIG. 1, the Q' output of the phase detector 1 is connected to the "shift right/left" control input of the delay shift register 4. The CLKS signal causes the delay shift register 4 to shift data bits right or left, depending on the state of the phase detector Q', thereby introducing more or fewer delay line elements in the delay line 2 to be connected in series. The delayed output of the delay line 2 is buffered by 12 to form an internal clock CLKI.

The internal clock is optionally connected through a reference delay circuit 7 to the feedback input of the phase detector 1, to introduce a phase shift equivalent to the delays of the semiconductor device input and/or output buffer 10 and 12. This practice is necessary if an internal clock is to be synchronized to a clock external to the semiconductor device.

In operation, with reference to FIG. 2, there exist three relative time positions in which CLKI can be with relation to CLKR. The first case is denoted by $CLKI_1$, which occurs when the rising edge of the reference clock CLKR 45 trails the rising edge of $CLKI_1$ 46, in which case the rising edge 46 must be delayed to enter into a phase detection window. The phase detection window is denoted by the shaded areas in FIG. 2 and is described in the prior art to be generated by subtracting the propagation delay through AND gate 23 and the setup time of flip/flop 26 from the fixed delay element 27. The second case is denoted by $CLKI_2$ 44, and illustrates the rising edge of internal clock $CLKI_2$ trailing the rising edge of the reference clock CLKR 45, but rising within the specified phase detection window demarcated by the dashed lines. The third case is denoted by $CLKI_3$, and occurs when rising edge of the internal clock $CLKI_3$ 43 trails the rising edge of the reference clock 45 and is outside the phase detection window, in which case the rising edge 43 must be delayed past the next rising clock edge 49 and into the next phase detection window. In both cases 1 and 3, delay elements are therefore added to the delay line, causing an increase in the delay. This is accomplished by the logic gates and the D-type flip-flop of the phase detector outputting a `1' to the "shift right/left" control input of the shift register. Therefore, the shift register is clocking in ones and shifting them from left to right. This covers an increase of delay which is continued until a rising edge of the internal clock CLKI occurs within the phase detection window, following the rising edge of the reference clock CLKR, as illustrated in case 2. Once case 2 has been attained, i.e. a `0' output from the phase detector, delay elements are removed from the delay line, effectively decreasing the delay until the rising edge of the internal clock steps just outside of the phase detection window. An increase in delay will then be required and the phase detector will cause the delay line to increase delay once again. This one-step-forward, one-step-backward process is continuously repeated to maintain a locked condition.

The shift right/left control signal applied to the delay line is clocked either by the reference clock or, optionally, for high frequency applications, by a shift clock signal CLKS from the clock divider circuit 8 which runs at half the reference clock frequency. If CLKS is used, the adding or removing delay elements from the digital delay line will occur on every second reference clock signal. The number of delay elements being used in the digital delay line corresponds to the number of sequential 1's stored in the left-most portion of the shift register.

Thus the delay of the delay path is always increased until the rising edge of the internal clock is eventually time-shifted past the next successive corresponding rising edge of the reference clock. It can be seen that the phase detection window used to align the external and internal clock edges is very narrow. When the internal clock is not within the time window, delay is increased continually until the desired edge of the reference clock is time shifted to be within the time window. As described earlier, once the internal clock is within the time window, the system decreases the delay slightly until the internal clock falls just outside the time window, which in turn will cause the system to once again increase delay. The repetitive shifting causes internal clock jitter of one delay step while trying to maintain the lock. It is clearly desirable to minimize this jitter, which implies delay elements with small delays. However, with smaller element delays more elements are required in the delay line to cover the same minimum-to-maximum delay range.

Furthermore, the small phase detection window characteristic of the phase detector, can cause a loss of lock condition if the system clock itself has jitter which will cause the phase detection window to move away from the lock. For example, if the internal clock edge falls within the phase detection window and the system clock experienced jitter, the system will bump the internal clock out of the phase detection window and send it searching for a new lock position by starting to increase delay. In order to solve this problem, the phase detection window for the phase detector must be made no less than two times one delay element delay to ensure lock.

The above prior art circuit thus has deficiencies caused by conflicting requirements. While it has been found to be reliable at start-up of operation, it can easily lose lock when the system clock has jitter, in the manner described above.

SUMMARY OF THE INVENTION

In accordance with the present invention, all operations of the digital delay locked loop are based on edge triggered synchronous logic only. Pulse width dependent events as found in the prior art are thus avoided. The fed back internal clock signal passes though a reference delay circuit, whose output is then sensed by the phase detector. A phase detection region is made to span virtually an entire clock cycle, in order to avoid losing lock as a result of system clock jitter. Finally, the unused portion of the delay line is disabled so as to prevent the unnecessary consumption of power by unused elements. The result is significant tolerance to system clock jitter, with reliable start-up locking.

The main states of the DLL system consist of seeking a phase detection region, entering that region and seeking initial lock, closing the loop and enabling a clock jitter filter to prevent falling out of the lock condition as may result from system clock jitter. A large phase detection region results which is substantially a clock cycle wide, rather than the small phase detection window as defined as in the prior art. Substantial immunity from system clock jitter which would cause unlocking in the prior art is thus achieved.

In accordance with an embodiment of the invention, in a digital delay locked loop which comprises a phase detector for receiving and comparing a reference clock signal (CLKR) and an internal clock signal (CLKI) and for outputting an output clock signal (CLK_IO) through a digital delay circuit having a variable delay and through an output driver; a reference delay feedback circuit for receiving the CLK_IO signal, delaying the CLK_IO signal and providing the delayed CLK_IO signal as the CLKI signal to an input of the phase detector; a control for receiving an output signal from the phase detector and controlling the variable delay in the digital delay circuit so as to substantially lock the reference clock (CLKR) and the internal clock (CLKI) signals together in synchronization; an improvement in the control comprising a circuit for selectively adjusting the variable delay of the digital delay element so as to enable locking to occur between the reference 8 clock (CLKR) and the internal clock (CLKI) signals within a phase detection region which is a large fraction of a clock cycle of the reference clock.

In accordance with another embodiment, in a digital delay locked loop (DLL) which comprises a phase detector for receiving and comparing a reference clock signal (CLKR) and an internal clock signal (CLKI) and for outputting an output clock signal (CLK_IO) through a digital delay circuit having a variable delay and through an output driver; a reference delay feedback circuit for receiving the CLK_IO signal, delaying the CLK_IO signal and providing the delayed CLK_IO signal as the CLKI signal to an input of the phase detector; a control for receiving an output signal from the phase detector and controlling the variable delay in the digital delay circuit so as to substantially lock the reference clock (CLKR) and the internal clock (CLKI) signals together in synchronization; the digital delay circuit comprising a shift register coupled to a plurality of delay elements selectively switchable in series by the control to establish the variable delay based on a selected number of delay elements connected in series: an improvement comprising a switching circuit for disabling operation of delay elements of the shift register which are not switched to be part of the selected number of delay elements connected in series.

In accordance with another embodiment, in a semiconductor device, a method for achieving and maintaining a condition of locked synchronization between a first and a second clock signal, using a digital delay locked loop which includes a digital delay line comprised of shift register elements, and a phase detector and a jitter filter, comprises the following steps: upon initialization of the semiconductor device, clearing the states of the shift register elements of the digital delay line; forcing commencement of a progressive increase in a variable delay provided by the digital delay line, thereby allowing the semiconductor device to begin searching for the locked condition in a controlled and predetermined manner; continuing to increase delay in the digital delay line under control of output signals from the phase detector, even when predetermined rising edges of the first and second clocks are both within a phase detection region defined by a substantial portion of one period of the second clock; ceasing to increase delay in the digital delay line and closing the digital delay locked loop when a predetermined rising edge of the second clock passes a target edge of the first clock, thereby indicating a phase detection match; and with the digital delay locked loop closed, repetitively increasing and decreasing delay by an increment of one delay element around a lock point, thus enabling the phase detector and jitter filter to control the shift register direction to actively maintain the first and clock clocks in a lock condition; wherein the lock condition is defined as the synchronization of two predetermined rising edges of the first and second clock signals within a narrow segment of the phase detection region comprising the delay of one element of the digital delay line.

In accordance with another embodiment, a method of controlling a digital delay locked loop for synchronizing a first and second clock signal comprises progressively increasing a variable delay in the delay loop, with the delay loop in an open condition, while a targeted clock edge of the first clock signal is outside a predetermined phase detection region, the phase detection region surrounding a predetermined rising edge of the second clock, ceasing to increase the variable delay and closing the delay loop when the targeted clock edge lies within the phase detection region.

In accordance with another embodiment, a method of controlling a digital delay locked loop for synchronizing a first and second clock signal comprises progressively increasing a variable delay in the delay loop, with the delay loop in an open condition, while a targeted clock edge of the first clock signal is outside a predetermined phase detection region, the phase detection region surrounding a predetermined rising edge of the second clock, continuing to increase the variable delay with the delay loop open, when the targeted clock edge lies between a rightmost edge of the phase detection region and a predetermined rising edge of the second clock, ceasing to increase the variable delay and closing the delay loop, when the predetermined rising edge of the second clock is shifted past the targeted clock edge of the first clock, and with the delay loop in a closed and locked condition, maintaining the locked condition by repetitively increasing and decreasing the variable delay around a lock point.

In accordance with another embodiment, a method of controlling a digitally delay locked loop for synchronizing a first and second clock signal comprises upon start-up, opening the delay loop and incrementally increasing a variable delay until a rightmost boundary of a phase detection region is shifted in time past a targeted rising edge of the first clock, indicating a phase detection region entry, activating a clock jitter filter and continuing to increase the variable delay until a predetermined rising edge of the second clock signal is incrementally time shifted past the targeted rising edge of the first clock signal and indicating an initial phase match, closing the delay loop and incorporating the jitter filter in the loop, with the delay loop closed, if the predetermined rising edge of the second clock signal lags the targeted rising edge of the first clock signal by an amount which is shorter than the second clock signal's logic low interval, decreasing the variable delay until the predetermined rising edge of the second clock signal is time shifted to precede the targeted rising edge of the first clock signal, or if the predetermined rising edge of the second clock signal leads the targeted rising edge of the first clock signal by an amount which is shorter than the second clock signal's logic high interval, increasing the variable delay; thereby maintaining the delay loop in a closed and locked condition.

In accordance with another embodiment, a control circuit for a digital delay locked loop for synchronizing a first and a second clock signal, comprises a circuit for progressively increasing a variable delay in the delay loop, with the delay loop in an open condition, while a targeted clock edge of the first clock signal is outside a predetermined phase detection region, the phase detection region surrounding a predetermined rising edge of the second clock, and a circuit for increasing the variable delay and closing the delay loop when the targeted clock edge lies within the phase detection region.

BRIEF INTRODUCTION TO THE DRAWINGS

A better understanding of the invention will be obtained by considering the detailed description below, with reference to the following drawings, in which.

DETAILED DESCRIPTION OF EMBODIMENTS OF THE INVENTION

Figure 3:
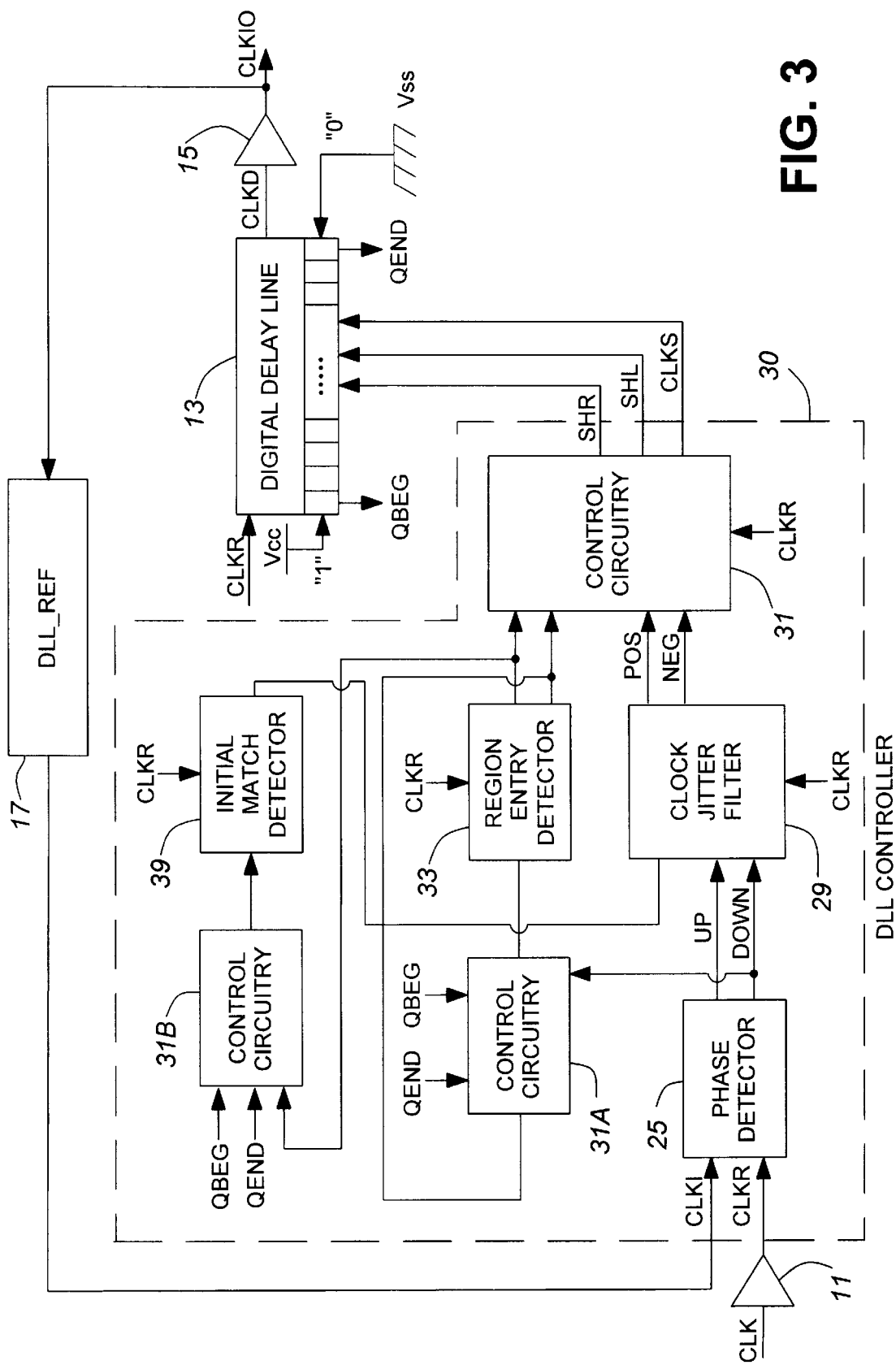
FIG. 3 is a block diagram illustrating a digital delay locked loop in which an embodiment of the present invention is contained.

FIG. 3 illustrates the main blocks used to form an embodiment of the present invention. An external main or system clock CLK is applied to a semiconductor device, passing through an input buffer 11 to become reference clock CLKR. Reference clock CLKR is fed from the output of the buffer to a phase detector 25. The outputs of the phase detector are coupled to control circuitry 31 via a clock jitter filter 29 (optional), as well as to other control circuitry 31A controlling a region entry detector 33. The region entry detector 33 inputs into control circuitry 31B to control both an initial phase match detector 39 as well as the shift left/right commands SHL, SHR. The digital delay line 13 receives the shift commands and produces the delayed clock signal CLKD, which in turn is buffered by a high fan-out clock driver 15 to a main internal input/output clock trunk line CLK_IO. The signal on the CLK_IO line is fed back through a reference delay circuit (DLL_REF) 17, to the phase detector 25 as the internal clock CLKI.

The delay locked loop as described above is used to generate the internal data clock CLK_IO which controls the output buffers in e.g. a synchronous dynamic random access memory (SDRAM) device. The purpose of the delay locked loop is to eliminate delay in the semiconductor device clock buffering resulting from the inherent delay caused by the elements in the clock path. The digital delay locked loop varies the delay in discrete steps by adjusting how many delay steps are included in a delay chain.

Figure 5:
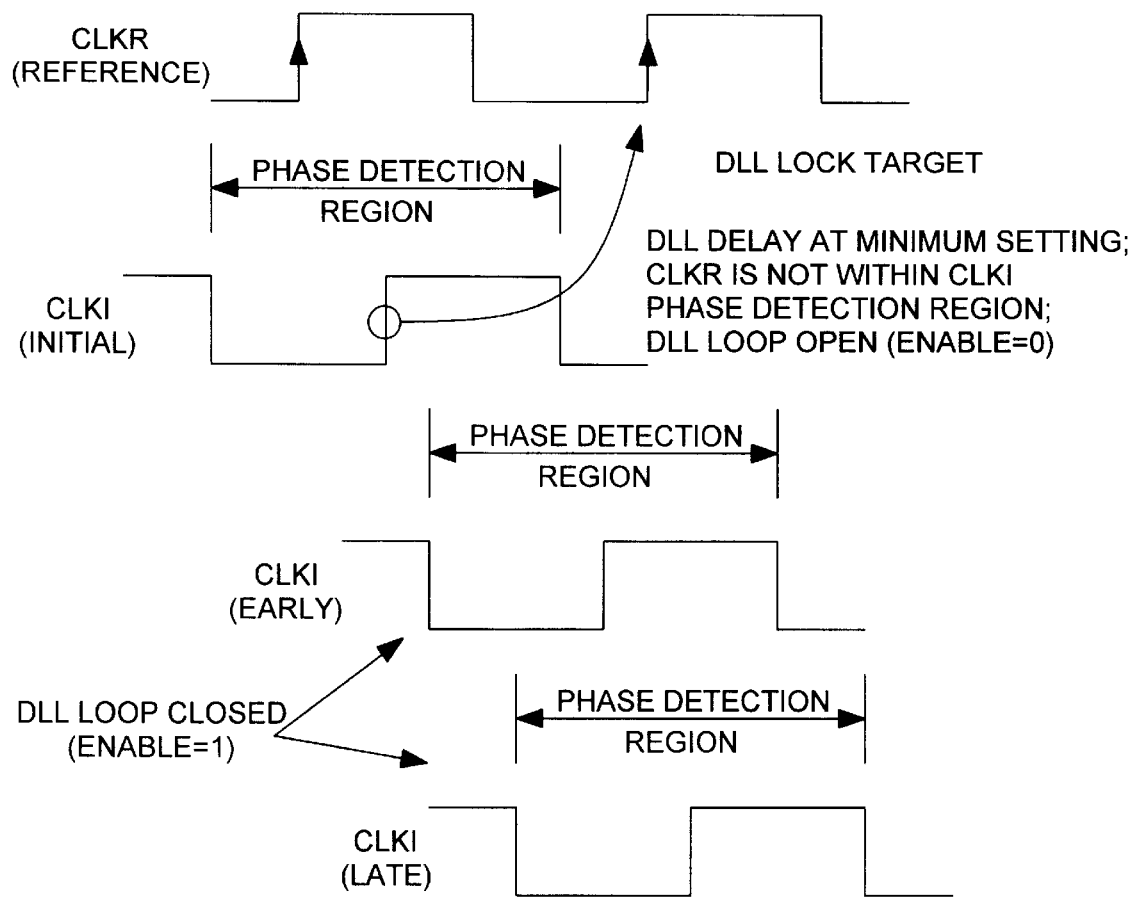
FIG. 5 is a timing diagram of signals, used to illustrate operation of the present invention.

With reference to FIG. 5, the conceptual operation of the digital delay locked loop will now be described using the four waveforms CLKR (Reference), CLKI (Initial), CLKI (Early) and CLKI (Late), which depict an initial open-loop condition, where DLL operation is outside a phase detection region, and a closed-loop condition, where DLL operation is within a phase detection region. DLL operation from start-up to lock condition can be described in terms of an initial, early and late position of a CLKI rising edge relative to a target rising edge of CLKR. The phase detection region is defined as an interval in which a target edge of the reference click and the internal clock are one half a period of the internal clock apart. Conceptually, the phase detection region surrounds the rising edge of a CLKI waveform, as shown in FIG. 5, which is to be synchronized to a target rising edge of a CLKR waveform. Note that in this embodiment of the invention, the phase detection region spans substantially an entire period of the internal clock CLKI. As will be described in more detail later, the phase detection window is determined by using an invented version of the phase detector output (Q') and providing it to the region entry detector 33 and initial match detector 39 to control the shift left/right commands SHL, SHR.

On start-up, the target rising edge of CLKR occurs more than a half a clock period, but less than a full clock period later in time than, i.e. it lags, the rising edge of CLKI and therefore the target rising edge of CLKR lies outside the phase detection region, as illustrated by the CLKI(initial) case in FIG. 5. On start-up the control circuitry opens the DLL feedback loop and forces the variable delay line to increase its delay incrementally, until a falling edge of CLKI, defining the rightmost boundary of the phase detection region, is shifted past the CLKR target rising edge i.e., the phase detection region overlaps the target rising edge of the CLKR. The leftmost boundary of the phase detection region is defined by the previous CLKI falling edge. On the next CLKR rising edge, the region entry detector flip-flop 25 in FIG. 4, as will be described in more detail later, is set based on the Q' output of the phase detector 25, thus indicating that the phase detection region is surrounding the CLKR target rising edge. In the absence of the optional clock jitter filter 29, the DLL feedback loop would then be closed and phase detector outputs would now be used to control delay line shift register shift direction. With the optional jitter filter 29 in place, the control circuitry 31 would continue to force the delay line shift register to shift right, past the initial phase detection region entry point, until the rising edge of CLKI, is incrementally moved just past the target rising edge of CLKR. At this time the initial phase match detector flip-flop 39 will be set, thereby closing the DLL feedback loop, incorporating the jitter filter in the path, and switching the shift clock CLKS from a one-in-two to a one-in-127 system clock mode, as will be described in more detail later. With the DLL feedback loop closed, if the rising edge of CLKI lags the target rising edge of CLKR (CLKI late) by an amount which is shorter than the CLKI low logic interval, phase detector 25 will instruct the shift register to begin shifting left to decrease the CLKI delay. Eventually, the rising edge of CLKI will be moved earlier in time to precede the target rising edge of CLKR. If the rising edge of CLKI leads the target rising edge of CLKR (CLKI early) by an amount which is shorter than the CLKI high logic interval, phase detector 25 will instruct the shift register to begin shifting right (DOWN) to increase the CLKI delay.

With the DLL loop closed, the above result of operation of the phase detector is conveyed via the UP/DOWN signals to the shift register through the optional (but desirable) filter 29, through control circuitry 31, as the shift left SHL and shift right SHR signals. The shift register is actually coupled to the delay line elements, one shift register bit per delay element as will described later. Under certain operating conditions both the SHL and SHR signals are held low to apply a synchronous CLEAR command to the shift register. The following truth table defines the shift register commands conveyed by the SHL and SHR signals:

| SHL | SHR | SHIFT REGISTER COMMAND |
|---|---|---|
| 0 | 0 | CLEAR |
| 0 | 1 | SHIFT RIGHT |
| 1 | 0 | SHIFT LEFT |
| 1 | 1 | <not allowed> |

These states ensure the proper operation of the DLL before, during and after the locked condition has been reached.

Figure 4:
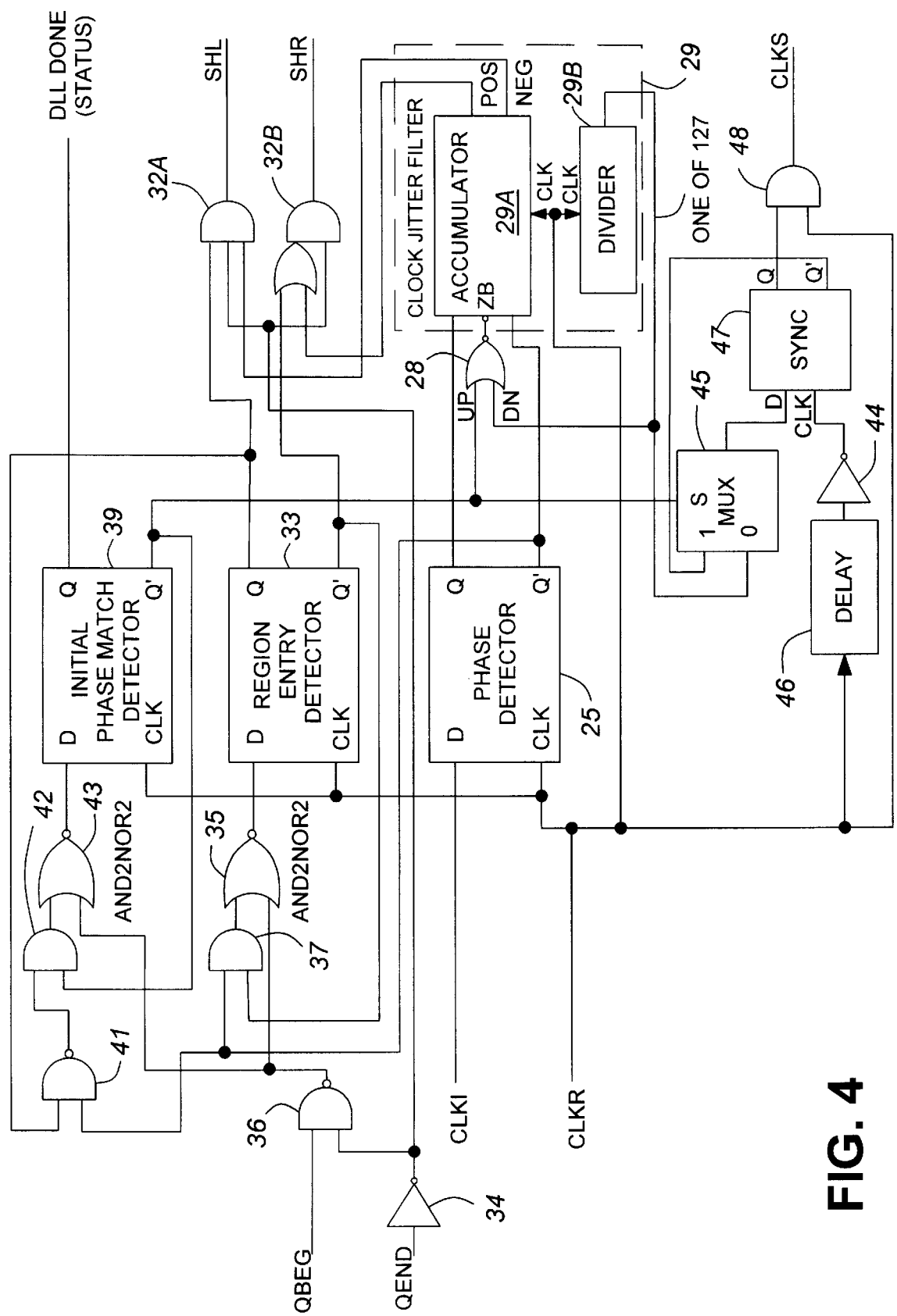
FIG. 4 is a schematic diagram of a control circuit in accordance with an embodiment of the present invention.

Turning to FIG. 4 which illustrates the components of the present invention in more detail, a digital delay locked loop circuit is shown which includes a phase detector 25 comprised of a single D-type flip-flop, which compares the reference (system) clock signal CLKR, applied to the CLK input of flip-flop 25, with the internal fed back clock signal CLKI, applied to the D input of flip-flop 25. The Q' output of phase detector 25 together with the Q' output of region entry detector D-type flip-flop 33 are applied to the D input of flip-flop 33, through the AND gate 37 of the AND2NOR2 complex gate 35. Also, the first bit residing in the shift register QBEG is combined with the inverse of the last bit residing in the shift register QEND in NAND gate 36 with the result of the combination being applied to the remaining OR input of AND2NOR2 complex gate 35. The reference clock CLKR is applied to the CLK input of flip-flop 33 to clock in the logical result of AND2NOR2 complex gate 35.

Upon start-up, if the first bit in the shift register is a logic 0, then the delay line is set to minimum delay and through NAND gate 36 and complex AND2NOR2 gate 35, the D input of flip-flop 33 will be forced to a logic 0. Thus the Q' logic value received from phase detector 25 will be inhibited from reaching the D input of flip-flop 33. Therefore, on the rising edge of CLKR, flip-flop 33 will remain clear if already clear, or be cleared if already set, where set means the Q output is logic 1 and cleared means the Q output is logic 0.

The logic 0 signal from the Q output of flip-flop 33 will force AND gate 32A output SHL to be a logic 0 (i.e. not shift left) and the logic 1 signal from the Q' output of flip-flop 33 will force complex AND gate 32B output SHR to be a logic 1 (i.e. shift right), together causing a shift right command to be applied to the shift register. Since the leftmost shift register element is hard-wired to voltage VCC, a shift right command will cause a logic 1 to enter the shift register on the rising edge of the next shift clock CLKS. As a result, the shift register first bit QBEG applied to NAND gate 36 will also be a logic 1, thus enabling flip-flop 33 to begin detecting the phase detection region.

Initially, because the digital delay line is set to the minimum delay, CLKI is at a logic 0 for all CLKR rising edges, causing the Q' output signal of phase detector 25 to remain a logic 1 in the presence of region entry detector 33 output Q' being at logic 1, thereby forcing complex AND2NOR2 gate 35-37 output to apply a logic 0 to the D input of flip-flop 33. The logic 0 D input to region entry detector flip-flop 33 results in a logic 0 Q output, indicating that the phase detection region has not been entered yet.

The above process continues with "1's" being right-shifted into the shift register on every CLKS rising edge, thereby increasing the delay of CLKI relative to CLKR in incremental steps, until the falling edge of the delayed CLKI signal occurs just after the target rising edge of CLKR. At this point, a logic 1 is clocked into phase detector 25, Q becomes logic 1 and Q' becomes logic 0, causing complex AND2NOR2 gate 35 and 37 to pass a logic 1 to the D input of flip-flop 33. On the next rising edge of CLKR, flip-flop 33 will be set, thus indicating that the phase detection region has been entered. The logic 1 on the Q output and logic 0 on the Q' output of flip-flop 33 together enable AND gates 32A and 32B to pass the NEG and POS outputs of clock jitter filter 29 through to generate the SHL and SHR control signals respectively. The POS and NEG outputs of the clock jitter filter phase accumulator portion 29A represent the accumulation of phase information over an interval defined by the clock divider 29B, as will described in further detail later. The POS output represents a net positive average phase relationship between CLKR and CLKI; i.e. on average, the rising edge of CLKI precedes the rising edge of CLKR. On the other hand, the NEG output represents the reverse condition wherein a net negative average phase relationship between CLKR and CLKI exists. A logic 0 on the Q' output of flip-flop 33 being fed back to AND gate 37, causes complex gate AND2NOR2 35-37 to maintain a logic 1 on the D input of flip-flop 33 regardless of logic level on the Q' output of the phase detector flip-flop 25.

An initial phase match detector is comprised of a flip-flop 39, having a clock input receiving the reference clock CLKR signal. Its D input receives a signal output from NAND gate 41 via complex gate AND2NOR2 gate 42-43. The inputs of NAND gate 41 receive signals from the Q output of region entry flip-flop 33 and the Q' output of phase detector flip-flop 25. Another input of AND2NOR2 gate 42-43 receives an input from the Q' output of flip-flop 39, to hold flip-flop 39 in a set state once it has been set. The first bit in the shift register QBEG signal is also applied to one input of AND2NOR2 gate 42-43 via NAND gate 36 to initialize flip-flop 39 on startup.

The initial phase match detector 39 is used to detect a DLL startup condition where the internal clock CLKI has been delayed sufficiently to move its rising edge just past the rising edge of CLKR. Prior to initial phase match detection, the DLL feedback loop is open and the shift register is forced by the AND gate 32B to shift right only. However, once the initial phase match has been detected, the DLL feedback loop is closed, with the phase detector and jitter filter now controlling the shift register direction to actively maintain CLKI and CLKR locked.

Flip-flop 39 will be cleared with the first bit in the shift register QBEG being a logic 0, in a manner similar to flip-flop 33. Flip-flop 39 will be set on the rising edge of CLKR if the first bit in the shift register QBEG is a logic 1 and the Q output of the region entry detector flip-flop 33 is also a logic 1 in the presence of the Q' output of the phase detector 25 also being a logic 1.

The logic 1 on the Q output of the flip-flop 39 indicates that an initial phase match has been detected. The Q' output of flip-flop 39 is applied to an enable input ZB of clock jitter filter 29 via NOR gate 28, to which the UP and DOWN control signals output from flip-flop 25 are applied. The clock jitter filter 29 is preferably a phase accumulator 29A, e.g. an 8-bit synchronous up-down binary counter used as a phase accumulator and a 7-bit linear feedback shift register (divider) 29B used to set both the phase accumulation interval and the shift clock interval. The Q' output of flip-flop 39 also connects to the control input S of shift clock interval select multiplexer 45.

In operation, when the initial phase match has not been detected, i.e., the Q' output of flip-flop 39 is logic 1, the clock jitter filter 29 is disabled and held in a reset state by the ZB input receiving a logic 0 via NOR gate 28. This will force the POS signal connected to ORAND gate 32B to be a logic 0, and the NEG signal connected to AND gate 32A to be a logic 1. Furthermore, the logic 1 on the Q' output of flip-flop 39, applied to the control input S of shift clock interval select multiplexer 45, causes the multiplexer to select the Q' output of the SYNC flip-flop 47 to be applied to the D input of flip-flop 47, thereby allowing CLKS to function at one half the reference clock CLKR frequency.

The system clock signal CLKR is applied to the CLK inputs of accumulator 29A and divider 29B. The output of the divider 29B is applied to an input of multiplexer 45, which feeds a synchronizer flip-flop 47 to which a delayed and inverted 44 representation of the system clock CLKR signal is applied at its CLK input. The divided CLKR signal (e.g. divided by 2) appearing at the Q output of flip-flop 47 is thus synchronized with the falling edges of the system clock CLKR and is further applied to AND gate 48 in combination with the CLKR signal to form the shift register clock signal CLKS.

The flip-flop 47 serves to help the system on start-up to quickly find a lock. In a first of two modes, this flip-flop operates in a divide-by-two or toggle mode whereby a CLKS pulse is generated every second CLKR pulse. This toggling operation ensures that the shift register responds quickly to the need to find the phase detection region and lock condition. During this time, the jitter filter 29 is inhibited from operating.

Once the lock condition has been established and the jitter filter 29 has been enabled by the Q' output of flip-flop 39 being logic 0, the sync flip-flop 47 changes operating modes to operate in the interval mode whereby a CLKS pulse is generated every 127 CLKR pulses. Thus the flip-flop 39 activates the clock jitter filter 29 once the delay locked loop has detected an initial phase match condition. The main role of the clock jitter filter 29 therefore, is to reduce the delay locked loop's response to external clock jitter. In the prior art, such a filter was not used. Instead, a hard-wired connection was used between the phase detector and the phase locked loop shift up and shift down control inputs.

The DLL of the present invention can therefore lock even in the face of significant system clock jitter, e.g. nearly an entire clock cycle time, which is a significant improvement over the prior art system. The conflicting requirements in the prior art noted above are thus substantially avoided.

Figure 6:
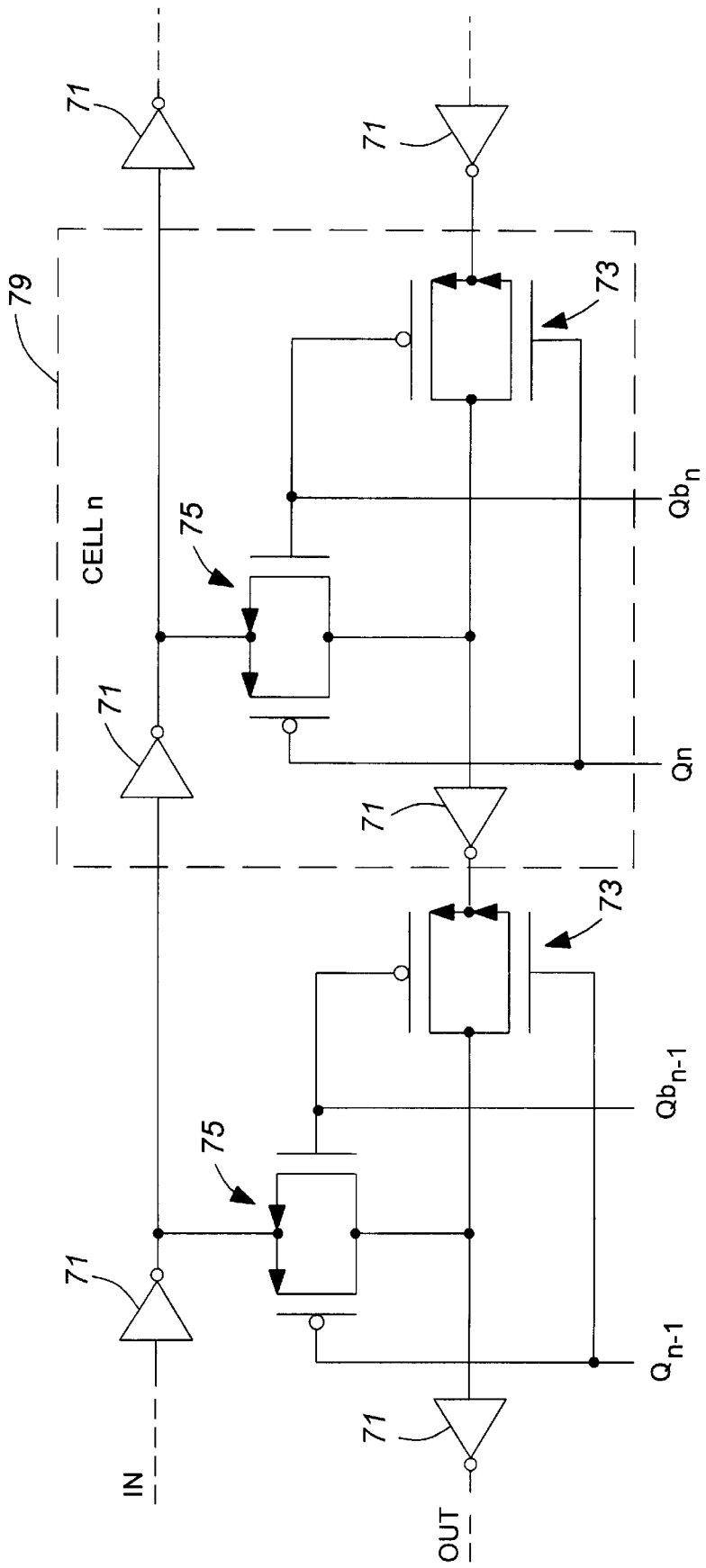
FIG. 6 is a block diagram illustrating a portion of a delay line in accordance with the prior art.

Turning now to FIG. 6, a prior art embodiment of a delay line element will be described. A delay line is comprised of cells 79 formed of delay elements such as inverters 71 which are connected in series in forward and backward direction, through series switches 73 and shunt switches 75. By receiving shift register bits $Q_{n-1}$, $Qb_{n-1}$, $Q_n$, $Qb_n$, the series and shunt switches connect the delay elements 71 in shorter or longer series paths from the delay line input IN to the delay line output OUT. Thus a delay path is comprised of a number of forward facing inverters connected via switches 73 to a number of backward facing inverters through a shunt switch 75. Note that the elements not connected as part of the active delay line are left on and thus continue to waste power. In order to avoid this power waste, the unused portions of the delay line should be disabled.

Figure 1:
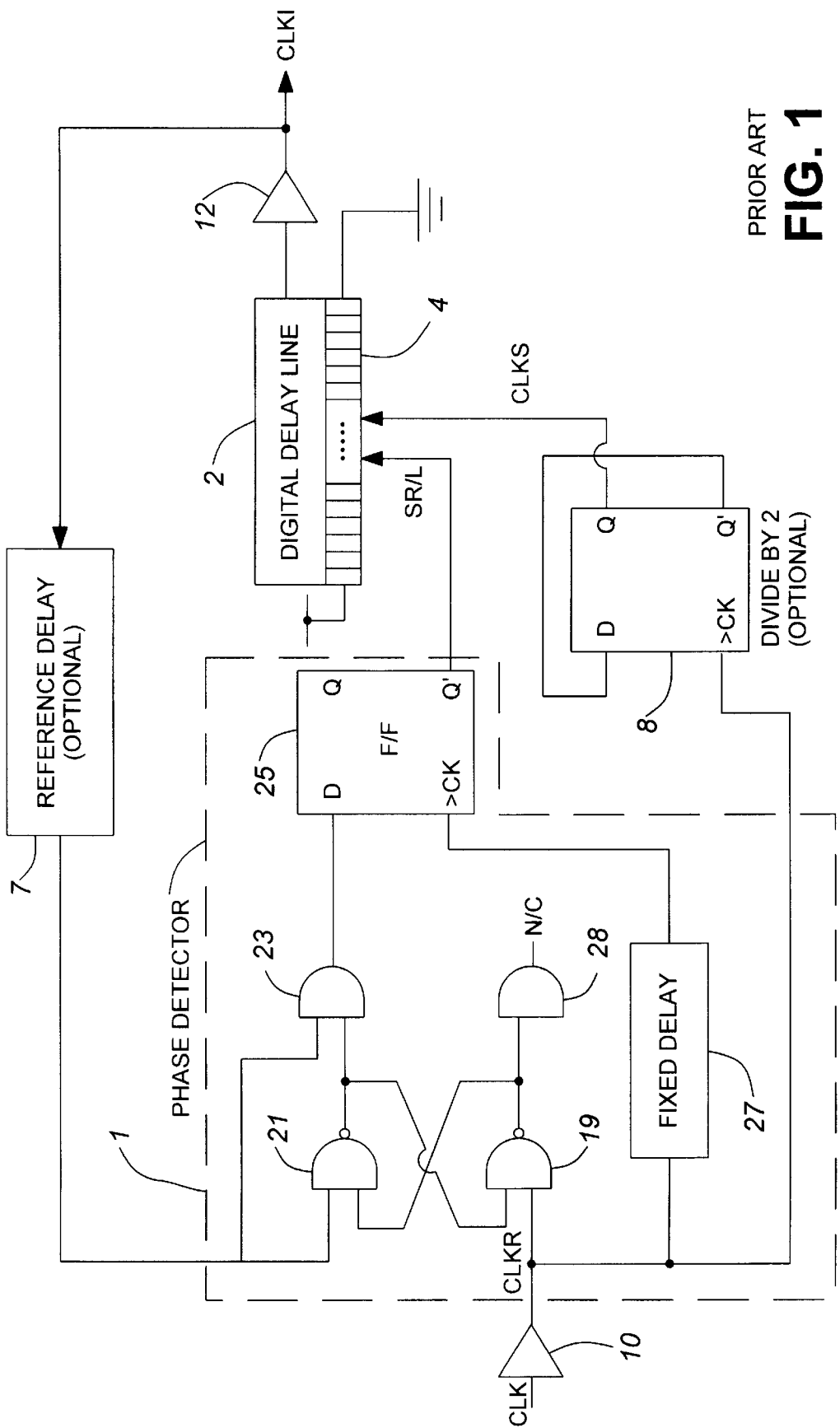
FIG. 1 is a block diagram of a prior art delay locked loop.
Figure 2:
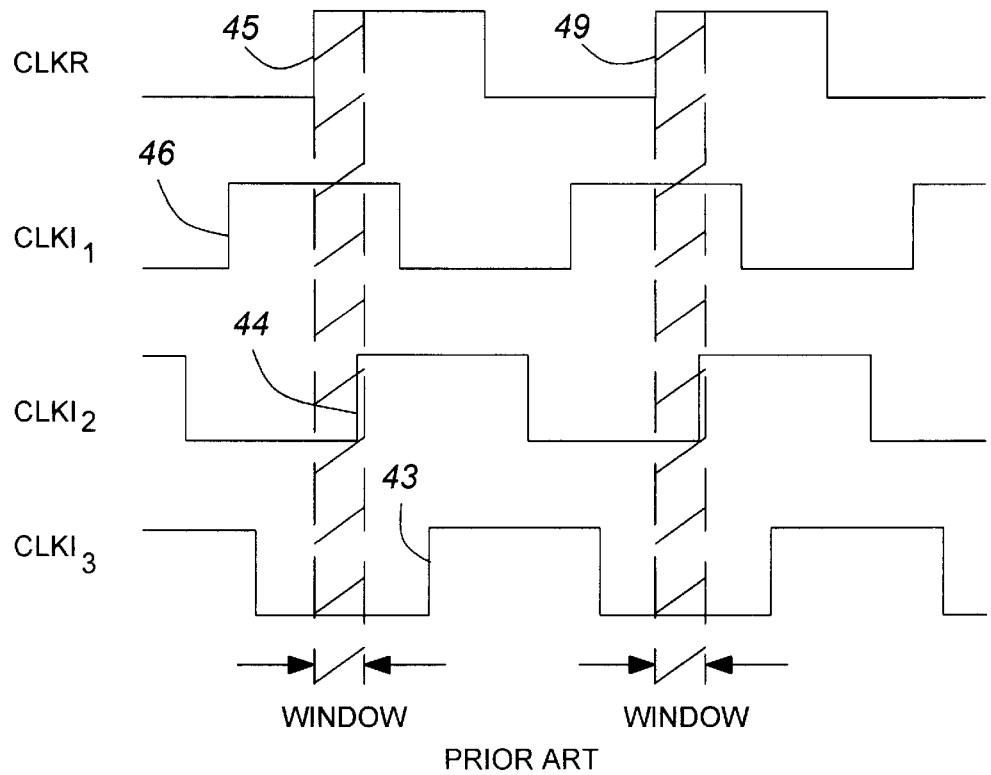
FIG. 2 illustrates reference and internal clock signals according to the prior art delay locked loop of FIG. 1.
Figure 7:
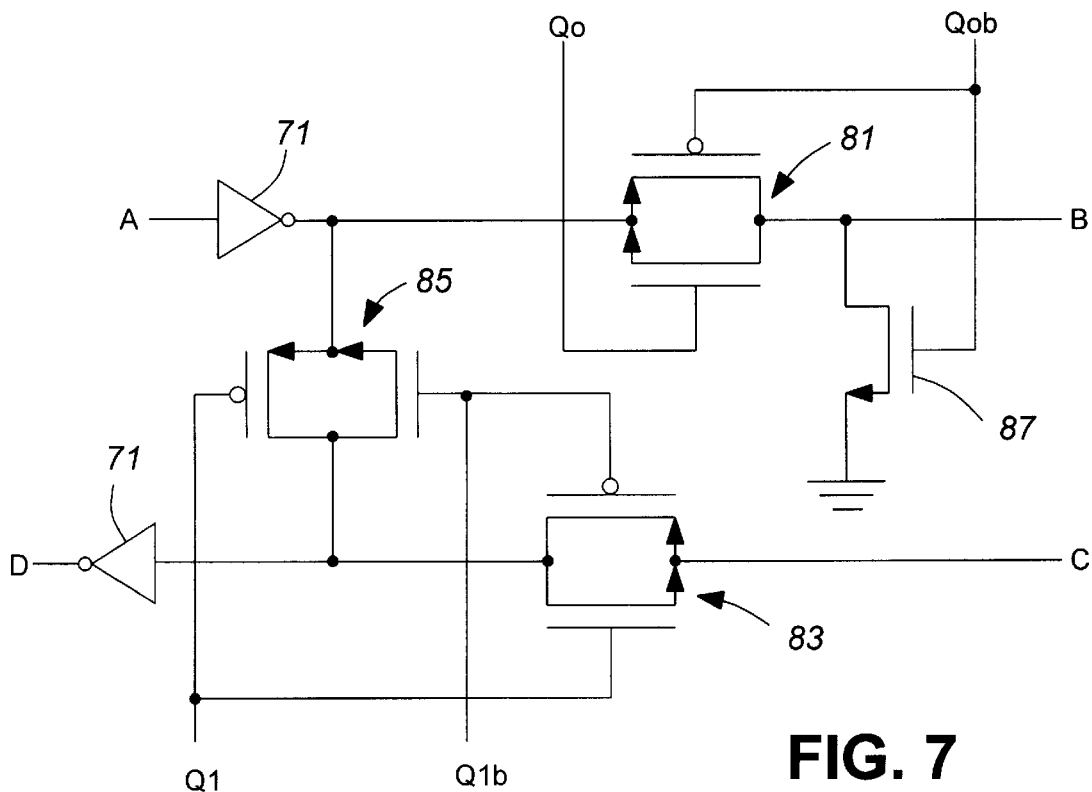
FIG. 7 is a schematic diagram of a cell of the digital delay line according to an embodiment of the present invention.

FIG. 7 illustrates a circuit of one delay element for achieving the disabling of unused portions of the delay line. The output of an inverter 71, having an input A of the forward signal direction delay path, is connected to one side of an FET CMOS pass gate 81. The other side of pass gate 81 is connected to a delay element output B. The input C of the delay element in the backward direction is connected to one side of an FET CMOS pass gate 83; the other side of pass gate 83 is connected to the input of another inverter 71 in the backward signal direction, the inverter having output D. The pass gates 81 and 83 form series switches.

The output of inverter 71 in the forward signal direction is also connected to one side of an FET CMOS pass gate 85, and the other side of the pass gate 85 is connected to the input of inverter 71 in the backward signal direction. Pass gate 85 forms the shunt switch for a typical delay unit.

Shift register bits Q0, Q0b, Q1 and Q1b are applied to the gates of the pass gate 85 to selectively control the addition of a delay element in series or the shunting of all following delay elements. However, in contrast to prior art circuit, in accordance with an embodiment of the present invention a switching element preferably comprised of an FET 87 is connected with its source-drain circuit between the output B and ground. Its gate is connected to receive a controlling bit from the shift register, so as to be switched in synchronism with pass gate 81. When pass gate 81 is switched to conduct between the output of the forward signal direction inverter 71 and output B, FET 87 is switched to be non-conductive. Conversely when pass gate 81 is switched to be non-conductive, FET 87 is switched to be conductive, and connects the delay line element to ground. In this fashion, the elements of the delay line which are not in the active delay path (e.g. which active delay path would exist between forward and backward signal path delay elements 71 and the shunt path 85) are disabled and therefore do not require operating power. As a result, there is reduction in the load on the system power supply, therefore reducing heat dissipation, etc. This power saving technique also counters the expected increase in dynamic power with increasing the frequency of the delay locked loop since fewer delay stages are acting at higher frequencies.

A person understanding this invention may now conceive of alternative structures and embodiments or variations of the above. All those which fall within the scope of the claims appended hereto are considered to be part of the present invention.

I claim:

1. In a digital delay locked loop (DLL) comprising a phase detector for receiving and comparing a reference clock signal (CLKR) and an internal clock signal (CLKI) and for delaying an output of the phase detector through a digital delay circuit having a variable delay and through an output driver and providing a DLL output clock signal (CLK_IO); a reference delay feedback circuit for receiving the CLK_IO signal, delaying the CLK_IO signal and providing the delayed CLK_IO signal as the internal clock I(CLKI) signal to an input of the phase detector; a control circuit for receiving the output of the phase detector and controlling the variable delay in the digital delay circuit so as to substantially lock the reference clock (CLKR) and the internal clock (CLKI) signals together in synchronization;

an improvement in the control circuit comprising a sub-ciruit for selectively adjusting the variable delay of the digital delay so as to enable locking to occur between a reference clock edge and an internal clock edge within a phase detection region; wherein said phase detection region is greater than or equal to one half and less than a full period of the reference clock, in which said phase detection region is determined by using an inverted version of the output of the phase detector to selectively control the variable delay of the digital delay line; wherein said phase detection region is nominally centred around a rising edge of the internal clock (CLKI).

2. In a digital delay locked loop (DLL) comprising a phase detector for receiving and comparing a reference clock signal (CLKR) and an internal clock signal (CLKI) and for outputting an output clock signal (CLK_IO) of the DLL via a digital delay circuit having a variable delay and via an output driver; a reference delay feedback circuit for receiving the CLK_IO signal, delaying the CLK_TO signal and providing the delayed CLK_IO signal as the CLKI signal to an input of the phase detector; a control for receiving an output signal from the phase detector and controlling the variable delay in the digital delay circuit so as to substantially lock the reference clock (CLKR) and the internal clock (CLKI) signals together in synchronization; the digital delay circuit comprising a shift register coupled to a plurality of delay elements selectively switchable in series by the control to establish the variable delay based on the selected number of delay elements:

an improvement comprising a switching circuit for disabling operation of delay elements which are not required to be part of the selected number of delay elements connected in series;

wherein said switching means for disabling is comprised of a plurality of switches selectively connecting to ground inputs of the series delay elements which are not required to be part of the selected number of delay elements connected in series.

3. In a semiconductor device, a method for achieving and maintaining a condition of locked synchronization between a first and a second clock signal, using a digital delay locked loop which includes a digital delay line comprised of shift register elements, and a phase detector and a jitter filter, comprising the following steps:

(a) upon initialization of the semiconductor device, clearing the states of the shift register elements of the digital delay line;

(b) forcing commencement of a progressive increase in a variable delay provided by the digital delay line with the delay locked loop open, thereby allowing the semiconductor device to begin searching for the locked condition in a controlled and predetermined manner;

(c) continuing to increase delay in the digital delay line under control of output signals from the phase detector, even when predetermined rising edges of the first and second clocks are both within a phase detection region defined by a substantial portion of one period of the second clock;

(d) ceasing to increase delay in the digital delay line and closing the digital delay locked loop when a predetermined rising edge of the second clock passes a target edge of the first clock, thereby indicating an initial phase match detection; and (e) with the digital delay locked loop closed, repetitively increasing and decreasing delay by an increment of one delay element around a lock point, thus enabling the phase detector and jitter filter to control the shift register direction to actively maintain the first and second clocks in a lock condition;

wherein said lock condition is defined as the synchronization of two predetermined rising edges of the first and second clock signals within a narrow segment of the phase detection region comprising the delay of one element of the digital delay line.

4. A method as defined in claim 3 further including the steps of:

(a) providing a shift clock for controlling the shift register of the digital delay line, and (b) disabling unused portions of the digital delay line by grounding inputs of unused delay elements.

5. A method as defined in claim 4 wherein the shift clock selectively assumes a first frequency defined as one half the system clock frequency during a start-up condition during which a lock condition is being sought, and assumes a second frequency which is substantially slower than the first frequency once the lock condition has been found.

6. A method of controlling a digital delay locked loop for synchronizing a first and second clock signal comprising:

(a) progressively increasing a variable delay in the delay loop, with the delay loop in an open condition, while a targeted clock edge of the first clock signal is outside a predetermined phase detection region, the predetermined phase detection region surrounding a predetermined rising edge of the second clock, (b) continuing to increase the variable delay with the delay loop open, when the targeted clock edge lies between a rightmost edge of the phase detection region and a predetermined rising edge of the second clock, (c) ceasing to increase the variable delay and closing the delay loop, when the predetermined rising edge of the second clock is shifted past the targeted clock edge of the first clock, and (d) with the delay loop in a closed and locked condition, maintaining the locked condition by repetitively increasing and decreasing the variable delay around a lock point.

7. A method of controlling a digital delay locked loop for synchronizing a first and second clock signal comprising:

(a) upon start-up, opening the delay loop and incrementally increasing a variable delay until a rightmost boundary of a phase detection region is shifted in time past a targeted rising edge of the first clock, (b) indicating a phase detection region entry, (c) activating a clock jitter filter and continuing to increase the variable delay until a predetermined rising edge of the second clock signal is incrementally time shifted past the targeted rising edge of the first clock signal and indicating an initial phase match, (d) closing the delay loop and incorporating the jitter filter in the loop, (e) with the delay loop closed, if the predetermined rising edge of the second clock signal lags the targeted rising edge of the first clock signal by an amount which is shorter than the second clock signal's logic low interval, decreasing the variable delay until the predetermined rising edge of the second clock signal is time shifted to precede the targeted rising edge of the first clock signal, or if the predetermined rising edge of the second clock signal leads the targeted rising edge of the first clock signal by an amount which is shorter than the second clock signal's logic high interval, increasing the variable delay; thereby maintaining the delay loop in a closed and locked condition.

8. A method as defined in claim 7 comprising:

(i) feeding the first clock as a reference clock to a phase detector, (ii) controlling a region entry detector with an output of the phase detector, (iii) generating shift right (SHR) and shift left (SHL) signals by passing output signals of the phase detector modified by the clock jitter filter, under control of the region entry detector, (iv) applying the SHR and SHL signals to a shift register for controlling a variable delay line for providing the variable delay, and (v) providing an output signal of the delay line as the second clock signal, and coupling the second clock signal to another input of the phase detector.

9. A method as defined in claim 8 including controlling an initial phase match detector by an output signal of the region entry detector, providing up and down shift signals from the phase detector to corresponding inputs of the clock jitter filter, and enabling the clock jitter filter by the initial phase match detector closing the delay loop in a locked mode of operation.

10. A method as defined in claim 6, in which the variable delay around the lock point is increased and decreased by a clock jitter filter comprising an accumulator for receiving and accumulating a predetermined number of up and down output signals of a phase detector, wherein the predetermined number is based on a counted number of first clock signals, and for outputting the accumulated signals for controlling the variable delay when the delay loop is in the closed and locked condition, thereby repetitively increasing and decreasing the variable delay around the lock point.

* * * * *